(12) United States Patent
Nishina et al.

(10) Patent No.: US 6,729,215 B2
(45) Date of Patent: May 4, 2004

(54) DICING MACHINE

(75) Inventors: Osamu Nishina, Mitaka (JP); Masami Takatori, Mitaka (JP); Yasuyuki Sakaya, Mitaka (JP)

(73) Assignee: Tokyo Seimitsu Co., Ltd., Mitaka (JP)

( * ) Notice: Subject to any disclaimer, the term of this patent is extended or adjusted under 35 U.S.C. 154(b) by 21 days.

(21) Appl. No.: 09/985,568

(22) Filed: Nov. 5, 2001

(65) Prior Publication Data

US 2002/0053586 A1 May 9, 2002

(30) Foreign Application Priority Data

Nov. 6, 2000 (JP) ........................................ 2000-337878

(51) Int. Cl.⁷ ............................. G06K 9/04; G01B 11/27
(52) U.S. Cl. ........................ 83/74; 83/412; 125/13.01; 225/103; 356/399; 364/192; 451/11
(58) Field of Search ................................. 364/559, 192; 83/74, 733, 36, 425.2, 471.3, 412–414, 404; 225/103; 451/6, 190, 194, 14, 10, 9, 11, 8; 125/13.01, 14, 35, 13 R; 250/548, 557, 561; 356/400, 380, 101, 399

(56) References Cited

U.S. PATENT DOCUMENTS

| | | | | |
|---|---|---|---|---|
| 4,213,117 A | * | 7/1980 | Kembo et al. ............... 382/145 |
| 4,233,625 A | * | 11/1980 | Altman ........................ 348/87 |
| 4,301,470 A | * | 11/1981 | Pagany ........................ 348/95 |
| 4,328,553 A | * | 5/1982 | Fredriksen et al. .... 356/139.04 |
| 4,407,262 A | * | 10/1983 | Wirz et al. ................ 125/13.01 |
| 4,531,060 A | * | 7/1985 | Suwa et al. .................. 250/548 |
| 4,656,896 A | * | 4/1987 | Bietz et al. .................... 82/1.11 |
| 4,672,557 A | * | 6/1987 | Tamura et al. .................. 716/8 |
| 4,720,635 A | * | 1/1988 | Uga ............................. 250/548 |
| 6,014,965 A | * | 1/2000 | Nishida ........................ 125/12 |
| 6,142,138 A | * | 11/2000 | Azuma et al. ................. 125/14 |
| 6,226,032 B1 | * | 5/2001 | Lees et al. ..................... 348/85 |
| 2001/0032533 A1 | * | 10/2001 | Sekiya ........................ 110/163 |

* cited by examiner

*Primary Examiner*—Allan N. Shoap
*Assistant Examiner*—Ghassem Alie
(74) *Attorney, Agent, or Firm*—Nixon Peabody LLP; David S. Safran

(57) ABSTRACT

In the dicing machine, a parallel adjustment process between a cut-line of a blade and cut-line images displayed on a monitor can be easily performed. In the dicing machine, at least one of the first and second cut-line images displayed on the monitor is electronically moved by an image moving device so as to arrange the first and second cut-line images in the same straight line on the monitor. Thus, in the dicing machine of the present invention, the parallel adjustment can be easily performed as compared with the conventional dicing machine in which the parallel adjustment is mechanically performed by moving an imaging device.

3 Claims, 4 Drawing Sheets

F I G. 1
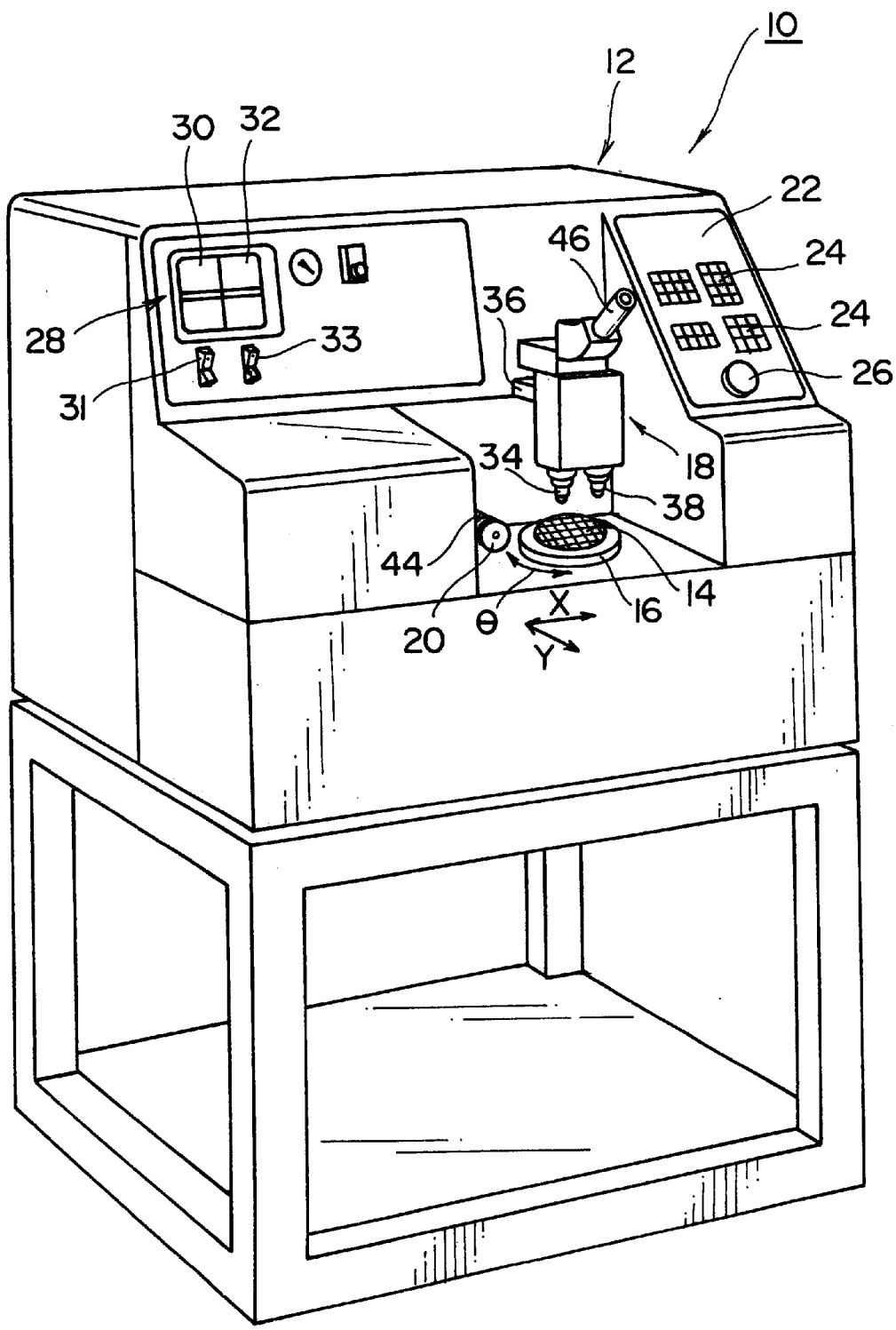

F I G. 2
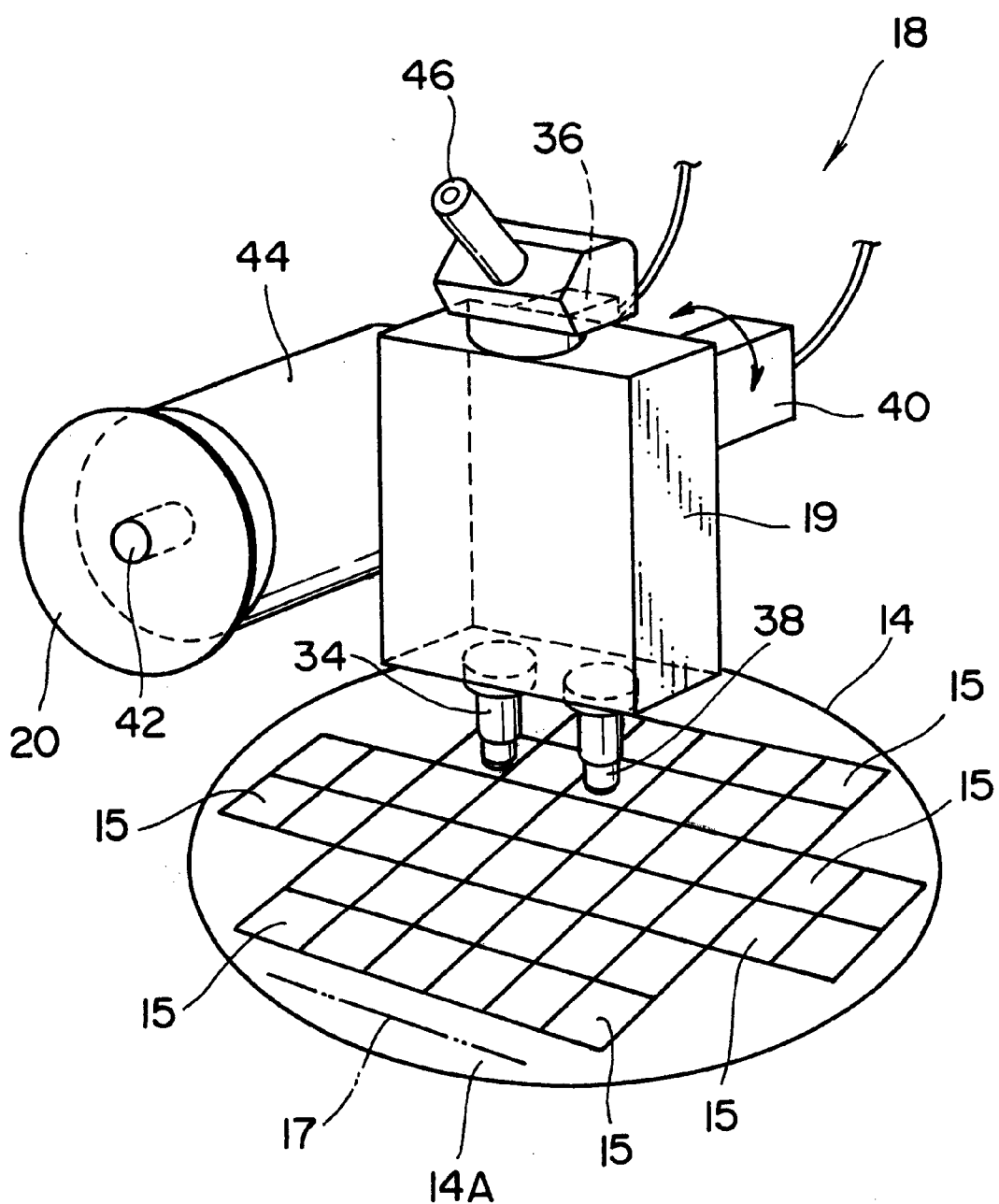

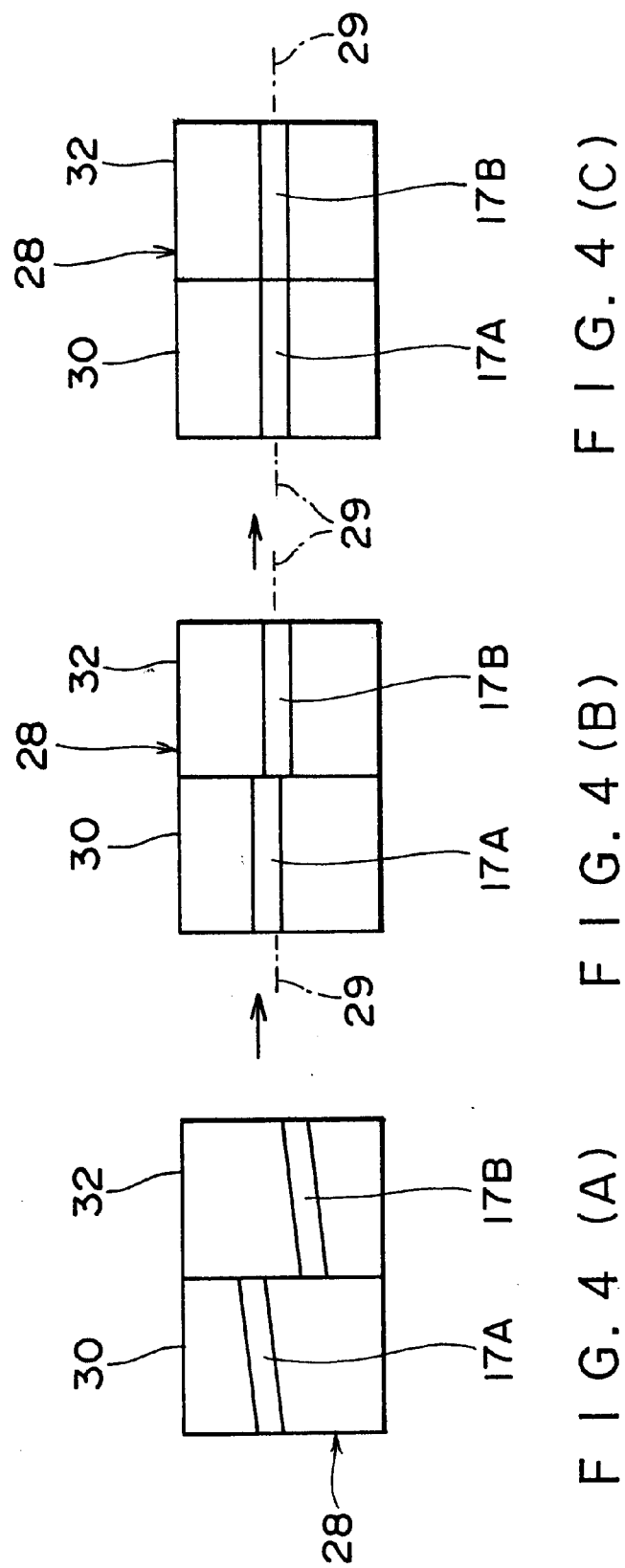

DICING MACHINE

BACKGROUND OF THE INVENTION

1. Field of the Invention

The present invention relates to a dicing machine in which a blade rotates at a high speed by the use of a spindle so as to cut a semiconductor wafer.

2. Description of the Related Art

A dicing machine which is commonly called a semi-automatic dicing machine is provided with a split-field microscope having a pair of object lenses that are arranged at positions as separate as possible from each other, and aligns a wafer in accordance with images of two cut-lines at the separate positions.

In manufacturing process of the dicing machine, parallel adjustment is performed in which two cut-line images displayed on a monitor are adjusted to be in parallel with a cutting line (hereunder referred to as a cut-line) of a blade so that the monitor displays an accurate cut-line of the blade.

In a conventional parallel adjustment, first, a semiconductor wafer is held on a cutting table of the dicing machine, and a portion of the wafer on which chips are not formed is cut by one line with the blade. The cut-line is then imaged by right and left CCD cameras which are arranged on optical axes of right and left object lenses of the split-field microscope, and right and left images of the cut-line are displayed on the monitor.

Next, the operator rotates the right and left CCD cameras while looking at the monitor so as to correct the right and left cut-line images to be parallel to each other on the monitor. At that time, the right and left cut-line images are not aligned, and the right and left cut-line images are displaced from the horizontal central axis on the monitor.

Then, the operator moves the right and left CCD cameras in a vertical direction while looking at the monitor so as to align the right and left cut-line images with the horizontal central axis of the monitor, and at the same time to arrange the right and left cut-line images in the same straight line within a deviation of 1 μm to 2 μm on the wafer. The conventional parallel adjustment is completed through the above-described process.

However, since the parallel adjustment in the conventional dicing machine is mechanically performed by moving the CCD cameras, a fine adjustment is difficult and it requires much time.

SUMMARY OF THE INVENTION

In view of the foregoing, it is an object of the present invention to provide a dicing machine in which a parallel adjustment process between a cut-line of a blade and cut-line images displayed on a monitor can be easily performed.

In order to achieve the above-described object, the present invention is directed to a dicing machine in which a blade rotates at a high speed so as to cut a semiconductor wafer, comprising: a first imaging device and a second imaging device which image a cut-line of the blade on the semiconductor wafer to capture a first cut-line image and a second cut-line image, respectively, the first and second imaging devices being arranged at a predetermined length between each other; a monitor which displays the first and second cut-line images side by side; and an image moving device which electronically moves at least one of the first and second cut-line images on the monitor to align the first and second cut-line images on the monitor.

According to the present invention, at least one of the first and second cut-line images displayed on the monitor is electronically moved by the image moving device so as to arrange the first and second cut-line images in the same straight line on the monitor. Thus, in the dicing machine of the present invention, the parallel adjustment can be easily performed as compared with the conventional dicing machine in which the parallel adjustment is mechanically performed by moving an imaging device.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 1 is a perspective view showing a whole structure of a dicing machine of a present embodiment;

FIG. 2 is another perspective view showing essential parts of the dicing machine in FIG. 1;

FIGS. 4(A), 4(B) and 4(C) are procedural views showing a left cut-line image and a right cut-line image displayed on a monitor.

DETAILED DESCRIPTION OF THE PREFERRED EMBODIMENTS

Figure 3:
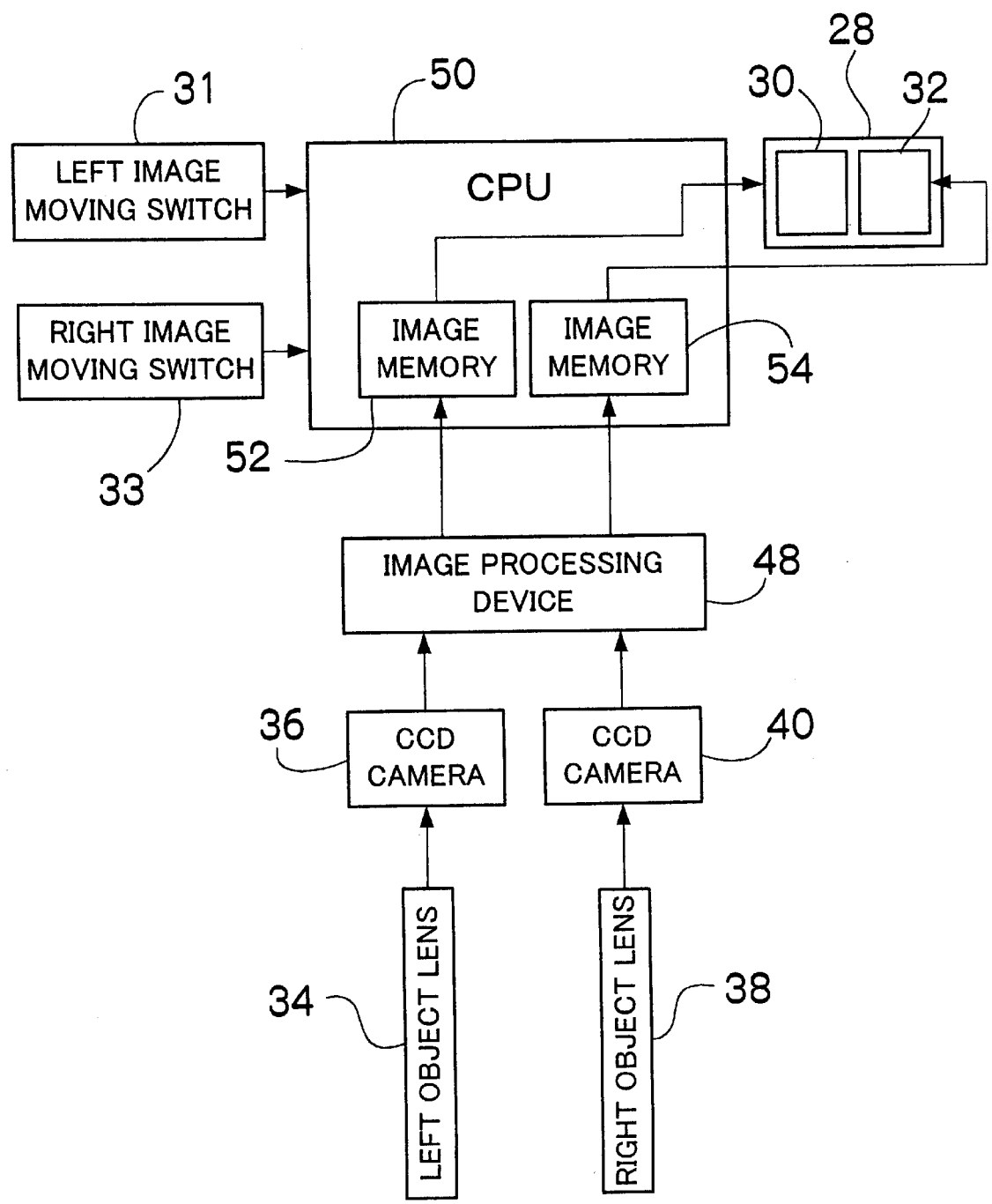
FIG. 3 is a block diagram illustrating a control structure related to a parallel adjustment of the dicing machine in FIG. 1.

Hereunder a preferred embodiment for a dicing machine of the present invention will be described in detail in accordance with the accompanying drawings.

A dicing machine 10 in an embodiment shown in FIG. 1 is a dicing machine of semi-automatic type at the substantial center of which a cutting table 16 for holding a wafer 14 is mounted on a θ axis rotation mechanism and an X-Y moving mechanism (both mechanisms are not illustrated). The wafer 14 held on the cutting table 16 is adjusted in terms of its position in a θ direction with a split-field microscope 18, which is disposed above the cutting table 16, and the θ axis rotation mechanism. Then, the cutting table 16 is moved along an X direction by the X-Y moving mechanism, whereby the wafer 14 on the cutting table 16 is cut by a blade 20, which is rotating at a high speed.

An operation panel 22 for the dicing machine 10 is provided to the upper right part of a main body 12 in FIG. 1, and buttons 24, a knob 26 and so forth, through which types of the wafers 14, etc. are inputted, are provided to the operation panel 22.

A monitor 28 having a screen is provided at the upper left part of the body 12 in FIG. 1. The screen of the monitor 28 is divided into a first or left screen 30 and a second or right screen 32. The left screen 30 displays an enlarged image of a portion of the wafer 14 that is captured by a first or left CCD camera 36 connected with a first or left object lens 34 of the split-field microscope 18, while the right screen 32 displays an enlarged image of a portion of the wafer 14 that is captured by a second or right CCD camera 40 connected with a second or right object lens 38 (see FIG. 2). The image displayed on the left screen 30 in FIG. 1 is vertically moved within the left screen 30 by operating a first or left seesaw switch (an image moving device) 31, which is attached to the downward part of the left screen 30. Likewise, the image displayed on the right screen 32 is vertically moved within the right screen 32 by operating a second or right seesaw switch (an image moving device) 33.

In order to maintain manufacturing accuracy of the wafer 14, cutting solution is jetted from a nozzle (not shown) toward a cutting point of the blade 20 which is cutting the wafer 14, and at the same time coolant is jetted toward the rotating blade 20 while the blade 20 is cutting the wafer 14.

The blade 20 is attached to an end of an air spindle 42, which constitutes a rotary shaft of the blade 20. The air spindle 42 is held by a cylindrical casing 44 in FIG. 2 through an air bearing, and is rotated at a high speed by a power of a high frequency motor (not shown), which is built in the casing 44. Parts of the blade 20 except the cutting part are covered with a flange cover (not shown), to which the nozzles for jetting the cutting solution and the coolant are attached.

As to the split-field microscope 18, the two object lenses 34 and 38 are fixed to the bottom of a body 19 at a predetermined length between each other. An eyepiece 46 is provided to the upper part of the body 19, and parts of the wafer 14 are observed through the eyepiece 46 as enlarged images through the object lenses 34 and 38. Further, the pair of CCD cameras 36 and 40 are provided at the back of the body 19. The CCD camera 36 is arranged on the optical axis of the object lens 34 and is supported to the body 19 rotatably on the optical axis of the object lens 34; on the other hand, the CCD camera 40 is arranged on the optical axis of the object lens 38 and is supported to the body 19 rotatably on the optical axis of the object lens 38.

Signals representing images of the wafer 14 are outputted from the CCD cameras 36 and 40 to an image processing device 48 in FIG. 3, which is built in the body 12 where the signals are converted into video signals and are stored to image memories 52 and 54 of a CPU 50. In other words, the image captured by the CCD camera 36 is stored in the image memory 52, and the image captured by the CCD camera 40 is stored in the image memory 54. The video signals stored in the image memories 52 and 54 are read out by the CPU 50 at a time of operating the seesaw switches 31 and 33, and are outputted to the monitor 28. Thereby, the image captured by the CCD 36 is displayed on the left screen 30 of the monitor 28 while the image captured by the CCD camera 40 is displayed on the right screen 32 of the monitor 28.

Now, a parallel adjustment method in the dicing machine 10 which is constructed as presented above will be described.

First, the semiconductor wafer 14 is held by the cutting table 16 of the dicing machine 10. The blade 20 is rotated and the cutting table 16 is moved in the X direction in order to cut by the blade 20 an unused portion 14A by one line on which no chips 15 (shown in FIG. 2) of the semiconductor wafer 14 are formed. A line 17 is the cut-line which is shown with an alternate long and two short dashes line in FIG. 2. The cut-line 17 is imaged by the left and right CCD cameras 36 and 40 through the left and right object lenses 34 and 38, respectively, of the split-field microscope 18, and the captured images are displayed on the left and right screens 30 and 32 of the monitor 28 as a first or left cut-line image 17A and a second or right cut-line image 17B, respectively, as shown in FIG. 4(A).

The operator then rotates each of the left and right CCD cameras 36 and 40 (shown in FIG. 2) while looking at the monitor 28 in FIG. 4(A) so as to correct the left and right cut-line images 17A and 17B to be parallel on the monitor 28 as shown in FIG. 4(B). At this point, the cut-line images 17A and 17B are not on the same straight line, and they are also displaced from a horizontal central axis 29 of the monitor 28.

Next, the operator operates the left and right seesaw switches 31 and 33 in FIG. 1 up and down while looking at the monitor 28, and aligns the left and right cut-line images 17A and 17B on the horizontal central axis 29 of the monitor 28 as shown in FIG. 4(C), and at the same time arranges the left and right cut-line images 17A and 17B in the same straight line within a deviation of 1–2 μm on the wafer 14. The parallel adjustment in the dicing machine 10 is completed through the above-described process.

According to the dicing machine 10 of the present embodiment, the parallel adjustment is performed in which at least one of the left cut-line image 17A and the right cut-line image 17B is electronically moved vertically on the monitor 28 with at least one of the seesaw switches 31 and 33, and the cut-line images 17A and 17B are arranged in the same straight line. Thus, the parallel adjustment in the dicing machine of the present invention can be performed more easily than the conventional dicing machine, in which the parallel adjustment is mechanically performed by moving the CCD cameras.

In the above-described dicing machine 10, the cut-line images 17A and 17B are mechanically corrected to be parallel by rotating the CCD cameras 36 and 40; however the way of parallel adjustment is not limited to this. For example, the cut-line images 17A and 17B stored in the image memories 52 and 54 are electronically rotated by the CPU 50 in accordance with operator's directions inputted through an image rotating switch provided to the dicing machine 10, in order to make the cut-line images 17A and 17B displayed on the monitor 28 as parallel with each other, without rotating the CCD cameras 36 and 40. Thereby, the parallel adjustment is accomplished by electronically rotating the images, and it can be performed even more.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A dicing machine in which a blade rotates at a high speed so as to cut a semiconductor wafer, comprising:

a first imaging device and a second imaging device which image a cut-line of the blade on the semiconductor wafer to capture a first cut-line image and a second cut-line image, respectively, the first and second imaging devices being arranged at a predetermined length between each other;

a monitor which displays the first and second cut-line images side by side; and an image moving device which electronically moves at least one of the first and second cut-line images on the monitor to align the first and second cut-line images on the monitor, a respective switch for manually operating each respective cut-line image to collineraly align the first and second cut-line images on the monitor.

2. The dicing machine as defined in claim 1, wherein each of the first and second imaging devices is rotatable.

3. The dicing machine as defined in claim 1, wherein the image moving device electronically rotates each of the first and second cut-line images on the monitor.

* * * * *